United States Patent
Light et al.

(10) Patent No.: US 6,274,822 B1
(45) Date of Patent: Aug. 14, 2001

(54) MANUFACTURE OF SEMICONDUCTOR CONNECTION COMPONENTS WITH FRANGIBLE LEAD SECTIONS

(75) Inventors: David Light, Los Gatos; Belgacem Haba, Cupertino; Thomas H. Distefano, Monte Sereno; Konstantine Karavakis, Pleasanton, all of CA (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 09/110,001

(22) Filed: Jul. 2, 1998

Related U.S. Application Data
(60) Provisional application No. 60/079,650, filed on Mar. 27, 1998.

(51) Int. Cl.[7] .................................................. H05K 3/30
(52) U.S. Cl. ........................... 174/260; 174/261; 28/832; 257/676; 257/734
(58) Field of Search .................................... 174/260, 261; 257/666, 668, 734, 735, 676, 773, 692; 29/827, 830, 832, 840

(56) References Cited

U.S. PATENT DOCUMENTS

| | | | |
|---|---|---|---|
| 3,374,537 | 3/1968 | Doelp, Jr. ............................. | 29/827 |
| 3,460,105 | 8/1969 | Birt et al. ............................. | 365/171 |
| 4,234,666 | 11/1980 | Gursky ................................. | 428/573 |
| 5,173,574 | 12/1992 | Kraus .................................... | 174/261 |
| 5,177,863 | 1/1993 | Lam ...................................... | 29/830 |
| 5,221,428 | 6/1993 | Ohsawa et al. ........................ | 216/14 |
| 5,225,633 | 7/1993 | Wigginton ........................... | 174/84 R |
| 5,230,144 | 7/1993 | Ootsuki ................................. | 29/827 |
| 5,266,520 | 11/1993 | Cipolla et al. ......................... | 427/96 |
| 5,291,059 | * 3/1994 | Ishitsuka et al. ..................... | 257/666 |
| 5,354,422 | 10/1994 | Kato et al. ............................. | 216/14 |
| 5,398,863 | 3/1995 | Grube et al. .......................... | 228/106 |
| 5,432,127 | 7/1995 | Lamson et al. ....................... | 29/827 |
| 5,477,611 | 12/1995 | Sweis et al. .......................... | 29/840 |
| 5,489,749 | 2/1996 | DiStefano et al. .................. | 174/261 |
| 5,491,302 | 2/1996 | DiStefano et al. .................. | 174/260 |
| 5,548,091 | 8/1996 | DiStefano et al. .................. | 174/260 |
| 5,597,470 | 1/1997 | Karavakis et al. ................... | 205/118 |
| 5,629,239 | 5/1997 | DiStefano et al. .................. | 216/14 |

FOREIGN PATENT DOCUMENTS

94/03036   3/1994  (WO).

* cited by examiner

*Primary Examiner*—Albert W. Paladini
(74) *Attorney, Agent, or Firm*—Lerner, David, Littenberg, Krumholz & Mentlik, LLP

(57) ABSTRACT

A semiconductor chip connection component having numerous leads extending side-by-side across a gap in a support structure, each lead having a frangible section to permit detachment of one end of the lead from the support structure in a bonding process. The frangible sections are formed by treating the lead-forming material in an elongated treatment zone extending across the regions occupied by numerous leads to provide a step defining a fracture point of the lead during a wire bonding process.

7 Claims, 5 Drawing Sheets

MANUFACTURE OF SEMICONDUCTOR CONNECTION COMPONENTS WITH FRANGIBLE LEAD SECTIONS

This application claims the benefit of Provisional Application No. 60/079,650 filed on Mar. 27, 1998.

FIELD OF THE INVENTION

The present invention relates to connection components useful in electrical assemblies such as in connecting semiconductor chips to substrates, and to methods of making such connection components.

BACKGROUND OF THE INVENTION

Semiconductor chips typically are connected to external circuitry through contacts on the surface of the chip. The contacts may be disposed in a grid on the front surface of the chip or in elongated rows extending along the edges of the chip's front surface. Each such contact must be connected to an external circuit element such as a circuit trace on a supporting substrate or circuit panel. In the conventional wire bonding process, the back surface of the chip is physically mounted on the substrate. A bonding tool bearing a fine wire is engaged with an individual contact on the face surface of the chip so as to bond the wire to the contact. The tool is then moved to a contact pad of the circuit on the substrate, while dispensing wire through the tool, until the tool engages the contact pad on the substrate and the wire is bonded thereto. This process is repeated for each contact.

In a tape automated bonding or "TAB" process, a dielectric supporting tape is provided with a hole slightly larger than the chip. Metallic leads are provided on the dielectric tape are cantilevered into the hole in the tape. An inner end of each lead projects inwardly beyond the edge of the hole. These plural leads are arranged side-by-side in rows. Each row of contacts on the chip is aligned with one such row of leads. The inner ends of the leads are bonded to the contacts of the chip by ultrasonic or thermocompression bonding. The outer ends of the leads are connected to the external circuitry.

The rapid evolution of the semiconductor art has created continued demand for incorporation of progressively greater numbers of contacts and leads in a given amount of space. With such closely spaced contacts, the leads connected to the contacts of the chip must be extremely fine structures, typically less than about 0.1 mm wide, disposed at center-to-center spacing of about 0.1 mm or less. Handling and connecting such fine, closely-spaced leads poses a formidable problem.

International Patent Publication WO94/03036, published Feb. 3, 1994 on copending International Application PCT/US93/06930, the disclosure of which is hereby incorporated by reference herein, offers a solution to these problems. As disclosed in certain embodiments of the '036 publication, a semiconductor chip connection component may include a plurality of electrically conductive leads and may also include a support structure such as a flexible, dielectric film with a compliant, typically elastomeric underlayer disposed beneath the flexible film. Each such lead desirably is connected to a terminal disposed on the surface of the support structure. A connection section of each lead extends across a gap in the support structure. A first end of each connection section, connected to one of the terminals, is permanently attached to the support structure, whereas the opposite second end of the connection section is releasably attached to the support structure. For example, the second end of each connection section may be connected through a frangible section connecting the second end to a bus structure anchored on the support structure.

Certain preferred connection components disclosed in the '036 publication have numerous elongated leads disposed side-by-side with the connection sections of the various leads extending across a common gap in the form of a slot in the support structure. In certain processes according to the '036 publication, the connection component is juxtaposed with the chip so that the support structure, and preferably a compliant layer thereof, overlies the contact-bearing surface of the chip and so that the gap or slot in the support structure is aligned with a row of contacts on the chip. This process serves to align each connection section with a contact on the chip. After placement of the connection component on the chip, each lead is engaged by a bonding tool. The bonding tool moves downwardly towards the surface of the chip. As the bonding tool moves downwardly, it disengages the second end of each lead connection section from the support structure, as by breaking the frangible section of the lead, and moves the connection section downwardly into engagement with the chip contact. At the same time, guide surfaces on the bottom of the bonding tool engage the connection section and guide it into more precise alignment with the associated contact. The bonding tool then bonds the connection section to the contact.

The end-supported lead bonding processes according to preferred aspects of the '036 publication offer numerous advantages. Because each lead is supported at both ends prior to bonding, it can be maintained in position until it is captured by the bonding tool. The bonding tool will reliably capture the correct lead, and hence there is little chance that an incorrect lead will be bonded to a contact. The process can be performed at reasonable cost. Moreover, the products resulting from preferred processes according to the '036 publication, allow free movement of the terminals on the support structure relative to the chip after connection, both in the X and Y directions, parallel to the chip surface, and in the Z or compliance direction perpendicular to the chip surface. Thus, the assembly can be readily tested by engaging a multiple probe test fixture with the terminals. When the terminals on the support structure are bonded to contact pads of a substrate, as by solder bonding or other processes, the assembly can compensate for differential thermal expansion between the chip and the substrate, as by flexing of the leads and deformation of the flexible support structure.

Certain components and processes according to the '036 publication can be used to fabricate semiconductor chip assemblies with closely spaced leads. Merely by way of example, rows of connection sections may be provided side-by-side at center-to-center spacing of about 100 micrometers or less, and may be successfully bonded to the contacts of the chip. Additional improvements in the bonding structures and techniques as set forth in the commonly assigned U.S. Pat. Nos. 5,398,863 and 5,491,302, the disclosures of which are hereby incorporated by reference herein, still further facilitate bonding of closely spaced leads and formation of reliable assemblies even where the leads are extremely small, using the basic techniques set forth in the '036 publication.

However, manufacture of the preferred connection components for use in these processes has heretofore required precise control of photoforming processes. The leads utilized in certain end-supported lead bonding processes have incorporated connection sections of substantially uniform widths and frangible sections having widths less than the width of the connection section. For example, the frangible section may be defined by a pair of V-shaped notches extending inwardly towards one another in the widthwise direction from laterally opposite edges of the connection section. The width between the points of the V is substantially less than the width of the remaining portion of the connection section. Although this arrangement provides useful frangible sections, it imposes stringent requirements on the photoforming process. The process must be capable of forming feature sizes as small as the smallest width within the frangible section. Stated another way, the photoforming process must be more precise than required to form the connection sections themselves.

Bonding structures and techniques which overcome the limitations imposed by the photoforming process are disclosed in commonly assigned U.S. Pat. No. 5,629,239, the disclosure of which is hereby incorporated by reference. According to the '239 Patent, a plurality of leads, each extending over a gap in a support structure, include lead-forming material in an elongated strip-like lead region extending in a lead direction. Frangible sections in the leads are formed by applying a weakening treatment to the lead-forming material throughout an elongated treatment zone extending across a plurality of the lead regions transverse to the lead direction. The weakening treatment is applied without regard to the edge boundaries of the leads.

The weakening treatment may be applied after formation of the individual leads. Where the leads are formed in an additive plating process, the lead material may be deposited in the strip-like lead regions, and subsequently exposed to the weakening treatment. The weakening treatment may include exposure to radiant energy such as a laser beam to ablate the lead-forming material, chemical etchants or alloying agents, or mechanical deformation by a tool. These treatments can be applied after formation of the leads throughout the treatment zone. For example, radiant energy or chemical agents can be applied using a mask having an elongated slot defining the treatment zone extending across plural lead regions. There is no need to control the extent of the weakening treatment precisely in the width-wise direction of the leads, transverse to the leads themselves. The process used to form the leads need not provide features any finer than the width of the individual lead connection sections themselves. Stated another way, the width of each lead connection section can be as fine as the finest feature size permitted by the photoforming process.

Accordingly, there has been a desire heretofore for continuously improving methods of making connection components useful in end-supported lead bonding and for improved connection components. In particular, there has been a desire for processes which mitigate the requirement for precise photoforming steps in fabrication of such connection components.

SUMMARY OF THE INVENTION

One aspect of the present invention is to provide a semiconductor chip connection component having frangible leads and methods of manufacturing same. More specifically, the connection components desirably include a plurality of leads extending across a gap in a support structure, preferably side-by-side and parallel to one another. The gap delineates the support structure into a central portion and a peripheral portion which support first and second connection sections of the leads which extend across the gap. A frangible intermediate section of each lead is constructed in the shape of a step so as to concentrate the stress within the lead whereby it will fracture brittlely at a defined location upon application of normal force thereto by a bonding tool. The fracture point is created by forming a sharply defined step having a weakened fracture point within the lead. As the bonding tool moves each lead downwardly, the frangible intermediate section breaks, allowing the lead to move fully into engagement with a contact of an underlying semiconductor chip for permanent connection of the lead thereto.

A further aspect of the present invention is to provide methods for fabricating the semiconductor connection component having a frangible intermediate section in the nature of a step. The methods according to one aspect of the present invention include forming a base material layer of conductive material, such as copper, deposited over the outer surface of a dielectric layer forming a supporting structure. The base material layer may be deposited over the entire surface of the dielectric layer, or selectively, within the region of the connector components. The base material layer is patterned using a photomask so as to expose at least that portion where the frangible intermediate sections of the leads are to be formed. The exposed base material layer is etched using a suitable etching to reduce its thickness in comparison with that portion of the base material layer which is masked. The resulting base material layer forms a generally right angle step between the contiguous portions of the base material layer. Although the step in the base material layer has been formed by selective removal, it is contemplated that the entire portion of the base material layer which is exposed by the mask may also be removed, followed by redepositing of a thin layer of material forming the base material layer. The connection sections in one embodiment are arranged in spaced apart parallel planes integrally connected by the frangible intermediate section arranged at a right angle thereto. The resulting lead has a generally Z-shape. The thickness of the frangible intermediate section may be less than the remaining portion of the lead to enhance the frangibility of the lead at the fracture point.

Using a suitable patterned photoresist mask, a plurality of leads of, for example, gold, copper or a gold-copper composite, are deposited over the base material layer and the step formed therein. The leads are thus formed with a corresponding sharply defined step conforming generally to the configuration of the step in the underlying base material layer. Construction of the leads, and specifically the frangible intermediate section, is completed by masking the bottom surface of the dielectric layer. The mask is provided with openings corresponding to the desired locations of the gaps in the dielectric layer, as well as the frangible intermediate sections. The structure is subjected to ablation by radiant energy directed through the openings, thereby forming the gaps in alignment with the connection sections and frangible intermediate sections of the leads. The radiant energy applied typically includes a laser operating under conditions which will substantially ablate the dielectric material, but which will not substantially affect the material of the leads and the base material layer. Subsequently, the exposed portion of the base material layer is removed using a selected etchant which will not etch the material forming the leads.

In a further embodiment of the present invention, the connector component is provided with a U-shaped frangible intermediate section which is created by a pair of opposed sharply defined steps. As in the previous embodiment, the frangible intermediate section is designed to concentrate stress such that the lead within the frangible intermediate section will fracture brittlely at the defined location upon application of normal force thereto by a bonding tool. As a result of the foregoing processes used to form the frangible intermediate sections of the leads, the width of each lead connection section can be as fine as the finest feature size permitted by the photoforming process.

These and other objects, features and advantages of the present invention will be more readily apparent from the detailed description of the preferred embodiments set forth below, taken in conjunction with the accompanying drawings.

BRIEF DESCRIPTION OF THE DRAWINGS

The above description, as well as further objects, features and advantages of the present invention will be more fully understood with reference to the following detailed description of the manufacture of semiconductor connection components with frangible lead sections, when taken in conjunction with the accompanying drawings, wherein.

DETAILED DESCRIPTION OF THE PREFERRED EMBODIMENTS

Figure 1:
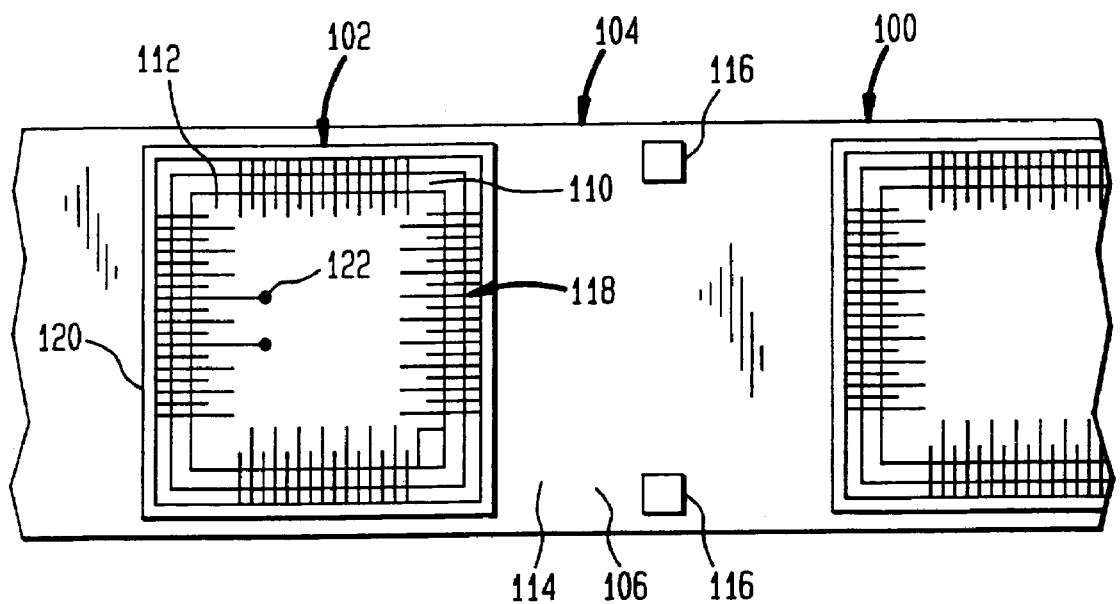
FIG. 1 is a fragmentary, diagrammatic plan view of a connection component in accordance with one embodiment of the present invention.
Figure 2:
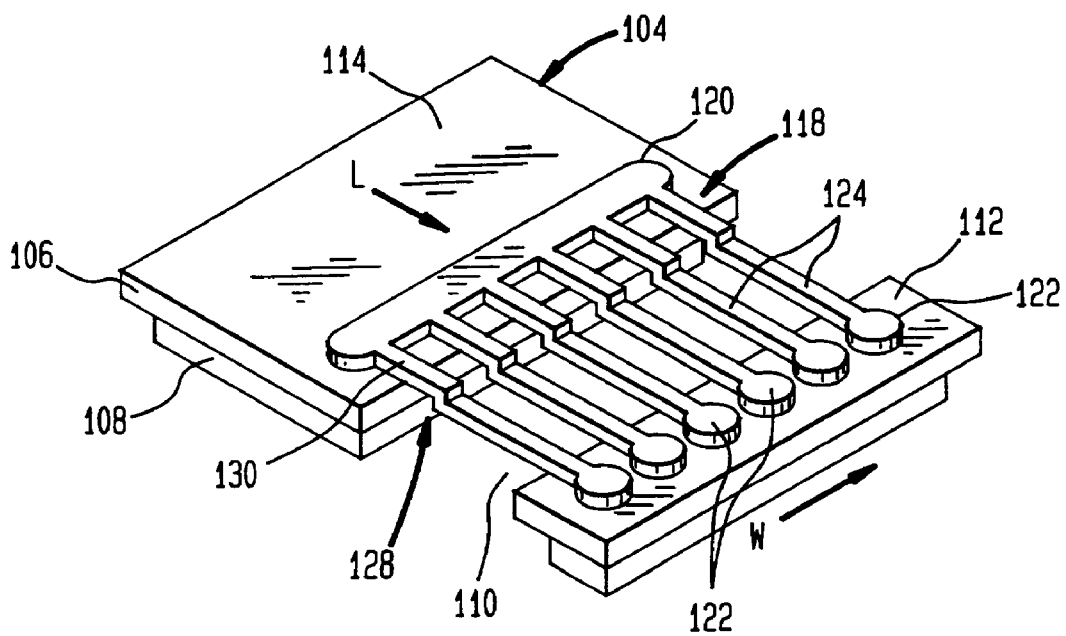
FIG. 2 is a fragmentary, diagrammatic perspective view depicting a portion of the connection component illustrated in FIG. 1 manufactured pursuant to the process of one embodiment of the present invention.

Referring now to the drawings, wherein like reference numerals represent like elements, there is shown in FIGS. 1 and 2 a component in accordance with one embodiment of the invention manufactured from a continuous tape 100. The tape 100 includes a plurality of such connection components 102 each incorporating a support structure 104. The support structure 104 of each component 102 is in the nature of a flexible, sheet-like dielectric layer 106, for example, a sheet of polyimide material. The support structure 104 also includes a soft, compliant layer 108 lying beneath the structure. The compliant layer 108 typically is formed of a low modulus material such as silicone, flexibilized epoxy or gel and the like.

The support structure 104 of each component 102 is provided with gaps 110 in the form of elongated slots extending through the support structure from its top surface to its bottom surface. The gaps 110 subdivide the support structure 104 of each component 102 into a central portion 112 and a peripheral portion 114. The gaps 110 merge with one another so that the central portion 112 of each component 102 is not connected to the peripheral portion 114 of the support structure 104 by any other portion of the support structure. Rather, as discussed below, the central portion 112 is temporarily connected to the peripheral portion 114 of the support structure 104 by elongated electrically conductive bonding leads 118 extending across the gaps 110. The tape 100 may be provided with features such as sprocket holes 116 to facilitate feeding and movement of the tape in the production processes.

Each component 102 in accordance with this embodiment has a plurality of elongated electrically conductive buses 120 extending on the peripheral portion 114 of the support structure 104 alongside gaps 110 so that one such bus extends alongside of, and substantially co-directionally with, each gap. The buses 120 of each component 102 form a generally rectilinear, hooplike structure encircling the gaps 110 and the central portion 112 of the support structure 104.

Each component 102 further has electrically conductive terminals 122 disposed on the central portion 112 of the support structure 104 and a plurality of bonding leads 118 extending outwardly from the terminals. Each lead 118 includes a first connection section 124 on the central portion 112 connected to the terminals 122 and extending outwardly across one of the gaps 110, a frangible intermediate section 128 joined to the end of the first connection section and a second connection section 130 joining the frangible intermediate section to the bus 120 lying alongside of the gaps. The connection section 130 may also be referred to as an end securement section. In addition, that portion of the connection section 124 overlying the support structure 104 can also be referred to as an end securement section The connection sections 124, 130 lie in spaced apart generally parallel planes integrally connected within the gaps 110 to the frangible intermediate section 128. The frangible intermediate section 128 of each lead 118 is arranged at an angle to the plane of the connection sections 124, 130, and as shown, generally at a right angle thereto. This results in the formation of the leads 118 having a step or Z-shape at the frangible intermediate section 128.

As shown in FIG. 2, the frangible intermediate sections 128 lie just inside the outer margins of gaps 110. The connection sections 124, 130 of all of the leads 118 associated with any given gap 110 extend generally perpendicular to the gap and generally side-by-side parallel to one another. In the embodiment illustrated, the connection sections 124, 130 and frangible intermediate sections 128 of the leads 118 bridge the gaps 110 and physically connect the central portion 112 of the support structure 104 with the peripheral portion 114 of the support structure.

Figure 3:
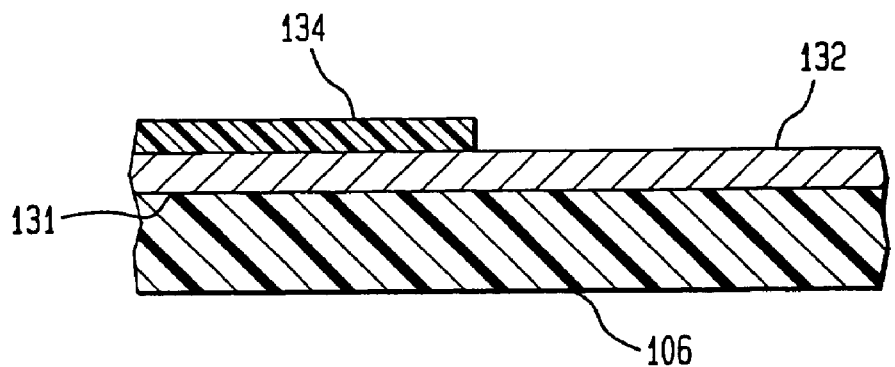
FIGS. 3, 4, 5, 6, 7 and 8 are cross-sectional views depicting the connection component at successive stages during the manufacturing process.

The connection components 102 as illustrated in FIGS. 1 and 2 can be made by a process as schematically illustrated in FIGS. 3–8. At the beginning of the process as shown in FIG. 3, the dielectric layer 106 forming the support structure 104 is a continuous uninterrupted strip which does not have the gaps 110 therein. While the dielectric layer 106 is in this condition, buses 120, leads 118 and terminals 122 are formed from a conductive lead-forming material, such as gold, copper, gold-copper composite and the like, by additive electroplating using a photographically patterned resist with open areas corresponding to the buses, leads and terminals where plating is desired, or by subtractive etching from a continuous sheet of the lead-forming metallic material on the dielectric layer 106 using a photographically patterned resist to permit etching only in areas where the lead-forming material is to be removed. The leads 118 can also be formed using embossing, laser scribing, coining and the like. The steps of the additive electroplating or subtractive etching processes may be performed in generally conventional ways.

Referring specifically to FIGS. 3–8, the outer surface 131 of the dielectric layer 106 is provided with a base material layer 132 of conductive material such as, for example, copper. Initially, the base material layer 132 may be deposited over the entire outer surface 131 of the dielectric layer 106, or selectively, within the region where the connector components 102 are to be formed, and more particularly, the leads 118, bus 120 and terminals 122. The base material layer 132 has an initial thickness of, for example, about 5 microns. A photoresist mask 134 is applied over the surface of the base material layer 132 exposing at least that portion of the base material layer where the frangible intermediate section 128 and connection section 130 of the leads 118 are to be formed. Mask 134 may be applied as a discrete, preformed element, or else may be formed by photographic techniques. The mask 134 may be formed from any material which will substantially resist the processes to be applied in the succeeding step. For example, the mask may be a polymer material such as photoresist, a sheet of molybdenum, or may include a layer of molybdenum on a polymeric substrate. The exposed base material layer 132 is etched using a suitable etching so as to reduce the thickness of the base material layer in region 136 corresponding to the location where the frangible intermediate sections 128 and connection section 130 of the leads 118 are to be formed.

Figure 4:
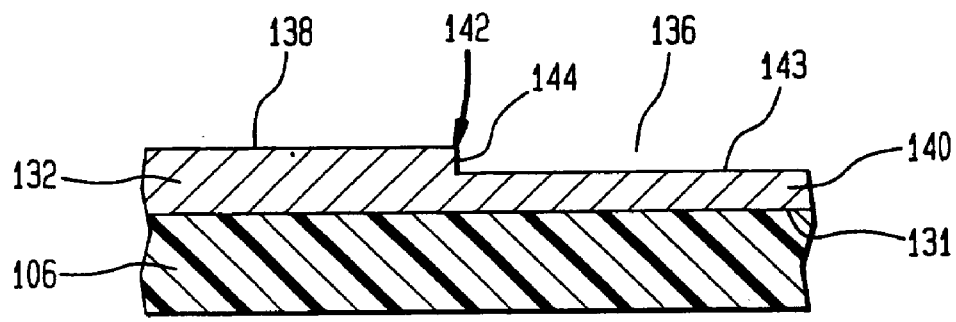
Figure 5:
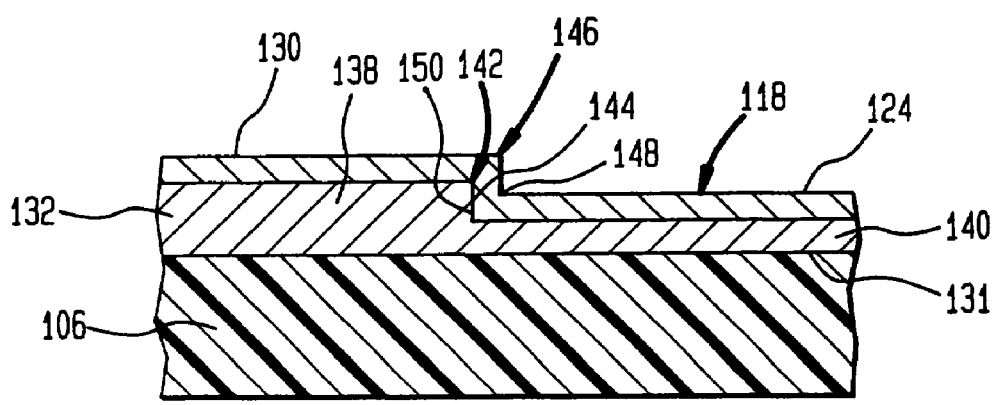

As shown in FIG. 4, the resulting etched base material layer 132 is formed to include a first section 138 of original thickness and a second section 140 within region 136 of reduced thickness. As a result of the thickness differentiation between the first and second sections 138, 140, a step 142 is formed therebetween having a generally vertical wall 144 arranged transverse to the outer surface 143 of the base material layer 132. As thus far described, the step 142 is formed by selective removal of a portion of the base material layer 132 so as to provide the second section 140 of reduced thickness. However, it is also contemplated that the entire portion of the base material layer 132 which is exposed by the mask 134 may also be removed, followed by redepositing of a thin layer of material forming the base material layer 132. Additionally, the step 142 can be formed by assembly of discrete layers, ablation, molding and like.

The outer surface 143 of the base material layer 132 within the first and second sections 138, 140 are suitably masked with a patterned photoresist mask (not shown) for forming the plurality of leads 118. The leads 118 are formed as a layer of copper material having a generally uniform thickness (t) of about 18–20 microns in a transverse direction to the outer surface 143 of the base material layer 132 within the first and second sections 138, 140. The material forming the leads 118 is deposited over the step 142 and onto the vertical wall 144 to form a continuous lead extending over the first and second sections 138, 140. The layer of material deposited over the vertical wall 144 of the base material layer 132 has a thickness (t') of about 15 microns or less. The leads 118 are thus formed with a corresponding step 146 having a pair of vertical spaced apart walls 148, 150 forming the frangible intermediate section 128 arranged parallel to the vertical wall 144 of the step 142. Alternatively, the step 146 can be formed directly in the lead 118 upon removal of the base material layer 132 using selective chemical or electrochemical etching, sputter etching, laser processing and the like.

It is contemplated that the thickness (t') between the walls 148, 150 will generally be less than the thickness (t) of the adjacent portion of the leads 118. This thickness differential is believed to contribute to the frangibility of the leads 118 as to be described hereinafter. Further, the first and second connection sections 124, 130 are formed in spaced apart generally parallel planes which are integrally connected by the frangible intermediate section 128 during deposit of the material forming the leads 118. The distance between the two connection sections 124, 130 is determined by the reduction in the thickness of the base material layer 132 within the second section 140. This, in turn, determines the relative length of the frangible intermediate section 128 in the vertical direction.

Although only a few leads 118 and terminals 122 are illustrated in the drawings, it should be appreciated that a typical component 102 may include hundreds of leads and terminals. Also, although the few terminals 122 illustrated in FIG. 2 are side-by-side, in practice the terminals are distributed over substantially the entire interior portion 112 of the dielectric layer 106. The portions of the leads 118 which will form the connection sections 124, 130 are disposed in rows. Within each row, all of the leads 118 extend in a lead direction L, and adjacent leads 118 are spaced apart from one another in a widthwise direction W. The widthwise dimension between each lead 118 desirably is between about 40 microns and about 115 microns depending on the actual width of the leads 118. Whereas, the center-to-center spacing between adjacent leads desirably is about 50 to about 150 microns. The width of each of the leads 118 is preferably about 15–20 microns. Each bus 120 desirably is about 80 to about 200 microns or more wide. The bus 120 and terminals 122 can be formed from the base material layer 132 prior to, during or subsequent to the formation of the leads 118 using the processes as thus far described. Each connection section 124, 130 is preferably about 30–40 microns for connection section 124 and about 350–500 microns long for connection section 130. The frangible section 128 will generally be closer to one gap edge than the other to preserve space and maximize the downset lead length. The aforementioned feature sizes can be achieved readily using conventional photoresist deposition, exposure and development techniques and conventional plating techniques.

Figure 6:
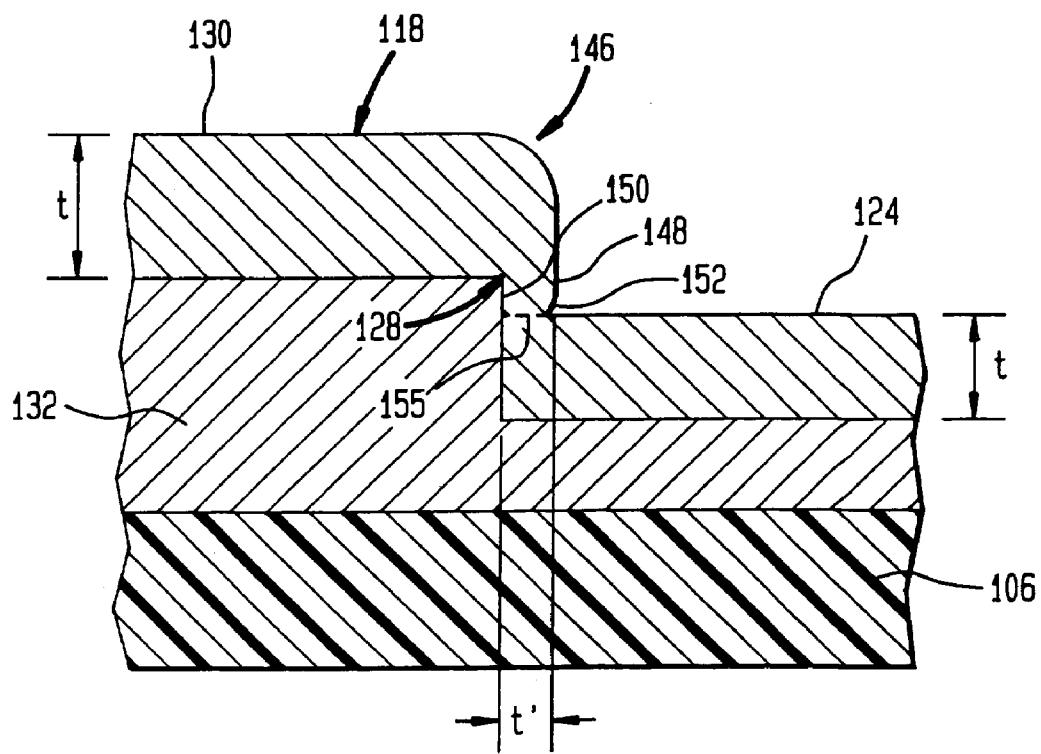

An enlarged cross-sectional view of the step 146 is shown in FIG. 6. It is contemplated that as the material forming the leads 118 is deposited over the step 142 formed within the base material layer 132, a depression 152 may also be formed at the base of the outer wall 148 to form a region of further reduced thickness between the outer and inner walls 148, 150. It is also contemplated that the thickness of the leads 118 within the frangible intermediate section 128 between the outer and inner walls 148, 150 may also be less than the thickness of the remaining portion of the leads, and specifically, the second connection section 130. As a result of this reduced thickness, the integrity of the leads 118 in the frangible intermediate section 128 is weakened thereby defining a general fracture location at a fracture point 155 indicated generally by the dashed lines. It is therefore contemplated that a region of reduced strength, for example, at the fracture point 155 is thus provided in the lead 118 to facilitate severing of the frangible intermediate section 128 from the connection section 130.

Completion of formation of the leads 118, and in particular, freeing the frangible intermediate section 128 from the dielectric layer 106, is accomplished by masking the bottom surface 154 of the dielectric layer 106 with a mask 156. The mask 156 has openings 158 corresponding to the desired locations of the gaps 110 in the dielectric layer 106. Each such opening 158 in the mask 156 is aligned with the connection sections 124, 130 and frangible intermediate sections 128. The structure is then subjected to ablation by radiant energy directed through opening 158, thereby forming the gaps 110 in alignment with the connection sections 124, 130 of the leads 118 and in alignment with the frangible intermediate sections 128. The radiant energy applied to provide this ablation typically includes a KrF laser operating under conditions which will substantially ablate the dielectric material 106, such as polyimide material, but which will not substantially affect the material of the leads 118 and the base material layer 132.

Figure 8:
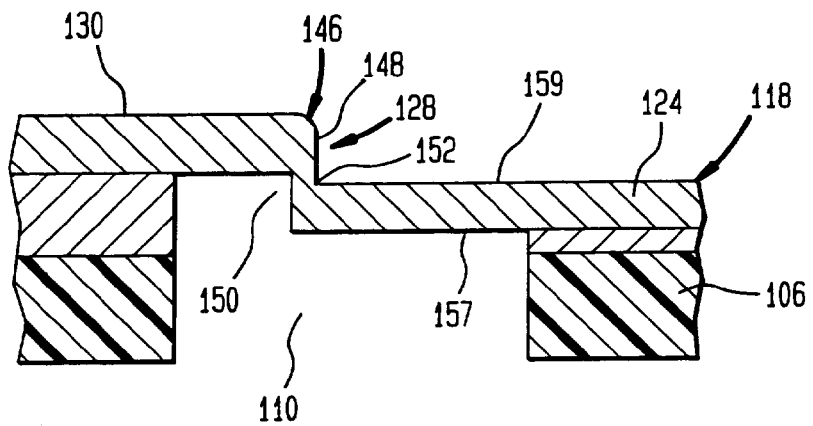

Subsequently, the exposed portion of the base material layer 132 within the opening 158 is also removed to free lead 118 using a selective etchant which will not etch the material forming the leads. As shown in FIG. 8, the frangible intermediate section 128 formed by the step 146 lies within the gap 110 integrally connecting the connection sections 124, 130 of the leads 118. The leads 118 may be overplated with a gold layer in the order of about 0.5 to 2 microns as a bonding material.

Figure 7:
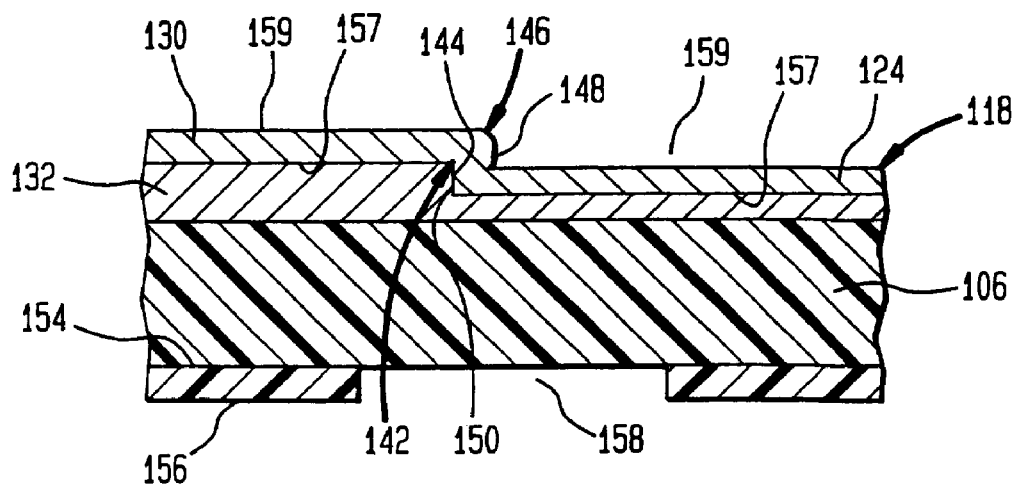

As shown in FIG. 7, the frangible intermediate section 128 is constructed in the shape of a step or jog in the upper and lower surfaces of the lead 118. The shape of the frangible intermediate section 128 is formed between the connection sections 124, 130 which each include inner and outer surfaces 157, 159 forming the lead 118. In this regard, inner wall 150 of the frangible intermediate section 128 is arranged transverse to the inner surface 157 of the leads 118 within the connection section 124, 130. Similarly, outer wall 152 of the frangible intermediate section 128 is arranged transverse to the outer surface 159 of the leads 118 within the connection section 124, 130. As such, the angles created by the step are generally right angles, although lesser or greater angles are also contemplated in the construction of the frangible intermediate section 128. As a result of the foregoing construction, the frangible intermediate section 128 of the leads 118 is arranged generally at a right angle to the connection sections 124, 130. As further shown, the outer surface 159 of connection section 130 is higher than the outer surface 159 of the connection section 124. Similarly, the inner surface 157 of the connection section 130 is higher than the inner surface 157 of the connection section 124. This results in the formation of the double jog shown.

Following complete separation of the leads 118, a compliant layer 108 is applied on the bottom surface 154 of the dielectric layer 106. Compliant layer 108 may be applied by lamination or by coating techniques such as stenciling or silk screening. Layer 108 desirably is formed from a compliant material such as an elastomer or a gel layer having gaps corresponding to the gaps 110 in the dielectric layer 106. The compliant layer 108 may be applied before formation of the gaps 110 and before the initial plating process used to form the leads 118.

The completed connection component 102 can be used in the same manner as the connection components described in the '239 Patent. Thus, each component may be positioned on a semiconductor chip so that rows of contacts on the chips are aligned with gaps 110 and hence aligned with the various rows of leads 118. During the positioning procedure, the connection sections 124, 130 of each lead 118 are substantially maintained in position on the support structure 104, because both ends of each lead connection section are supported. Thus, each connection section 124, 130 is positioned with respect to the associated contact by positioning of the connection component 102 with respect to the chip. Each lead 118 is then engaged by a bonding tool and more precisely aligned with the contact on the chip by the bonding tool.

As the bonding tool moves each lead 118 downwardly toward the contact, the frangible intermediate section 128 of the lead 118 breaks, allowing the lead to move freely into engagement with the contact, and the connection section 130 is permanently bonded to the chip contact. The frangible intermediate section 128 is designated to concentrate stress within the lead 118 such as in the area designated by the dashed lines at the fracture point 155 such that it will fracture under tension brittlely at the defined location upon application of normal force thereto by the bonding tool. The fracture point 155 is thus created by forming a sharply defined step 142 within the base material layer 132 upon which the lead 118 is formed to provide step 146. It is contemplated that the fracture point 155 is weakened by virtue of the thickness (t') differential between the walls 148, 150 and the thickness (t) of adjacent portion of the leads 118, as well as the possible presence of a depression 152. It is also contemplated that a fracture point can be formed in a similar manner at the upper portion of the frangible intermediate section 128 where it integrally joins the connection section 124.

Figure 9:
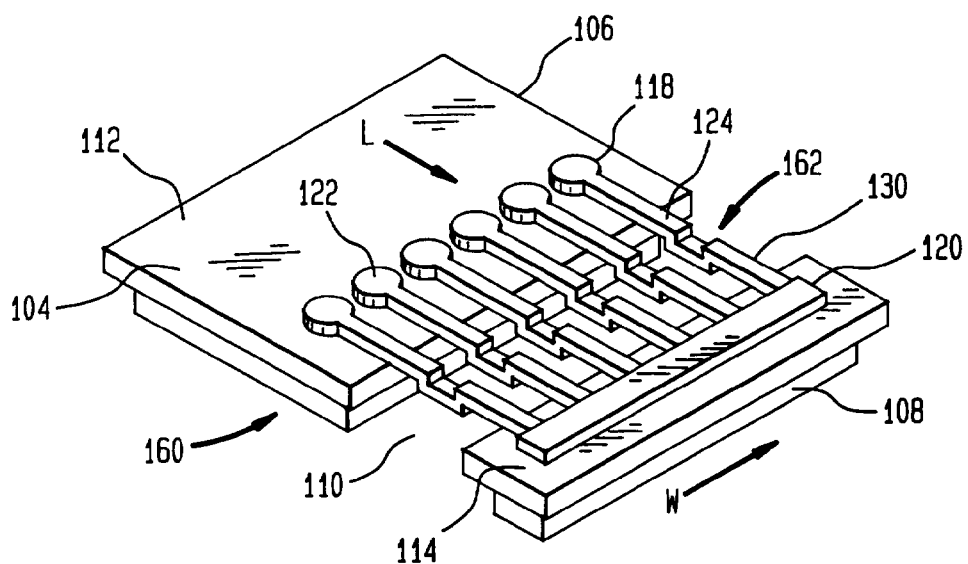
FIG. 9 is fragmentary, diagrammatic perspective view depicting a portion of the connection component illustrated in FIG. 1 manufactured pursuant to the process of another embodiment of the present invention.
Figure 10:
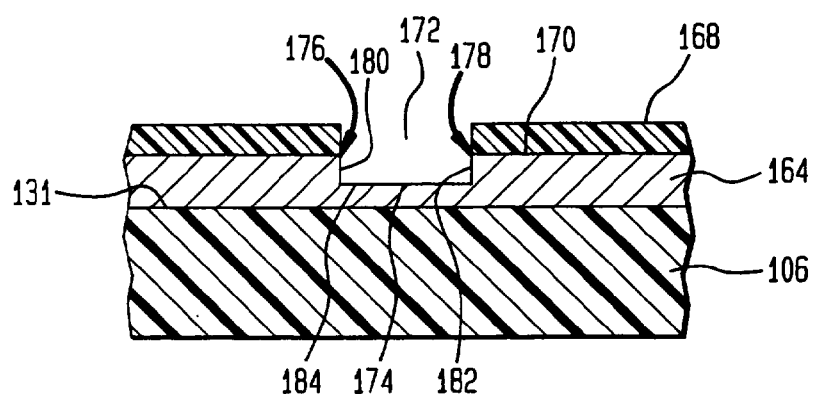
FIGS. 10, 11, 12 and 13 are cross-sectional views depicting the connection component as successive stages during the manufacturing process.

In a further embodiment of the present invention as shown in FIG. 9, a connector component 160 is provided with a U-shaped frangible intermediate section 162 in the nature of a depression within the lead 118. The remaining construction of the connector section 160 is similar in nature to the connection components 102 as described with respect to FIG. 2. Referring to FIGS. 9–13, the dielectric layer 106 is provided with a base material layer 164 on its outer surface 131 using any suitable depositing technique. A photoresist mask 168 is deposited on the outer surface 170 of the base material layer 164 and patterned to provide a narrow opening 172. The opening 172 is aligned at a location where it is desired to form the frangible intermediate section 162 within the leads 118. By means of the patterned opening 172, a portion of the exposed base material layer 164 is etched away using chemical etching, sputter etching, laser processing and the like to form a U-shaped opening 174 of predetermined depth. The U-shaped opening 174 is bound by a pair of spaced apart sharply defined steps 176, 178 having respective vertical side walls 180, 182 arranged substantially transverse to bottom wall 184. The bottom wall 184 is generally parallel to the outer surface 131 of the dielectric layer 106. The spacing between the side walls 180, 182 is preferably relatively small and may be in the order of about 40–60 microns.

Figure 11:
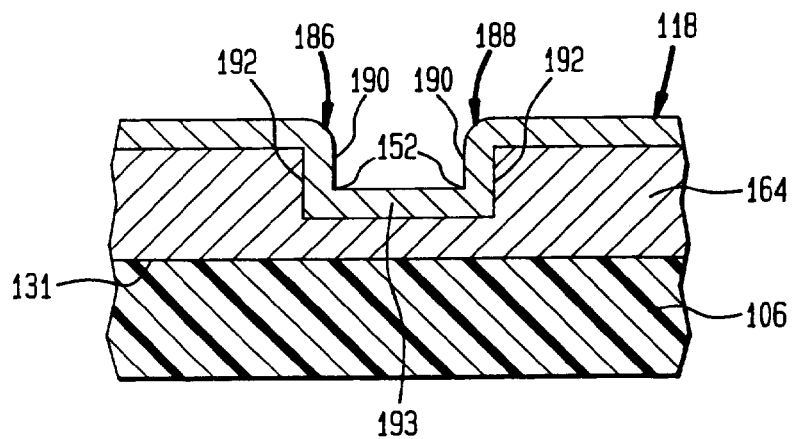
Figure 12:
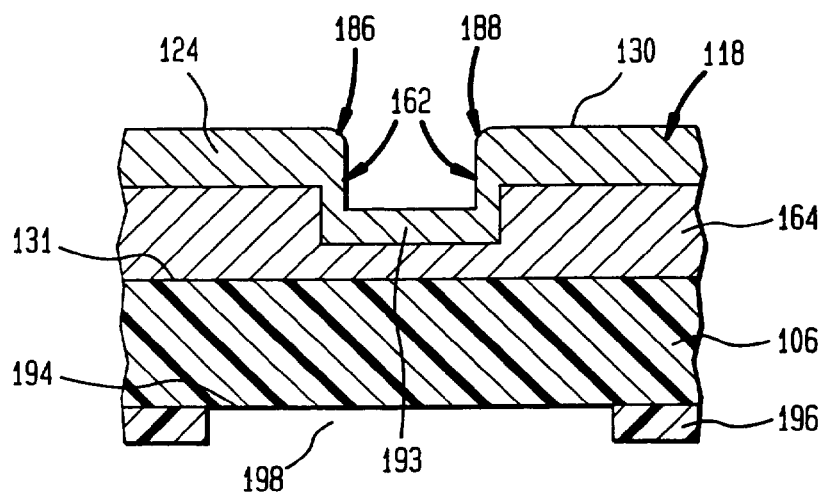
Figure 13:
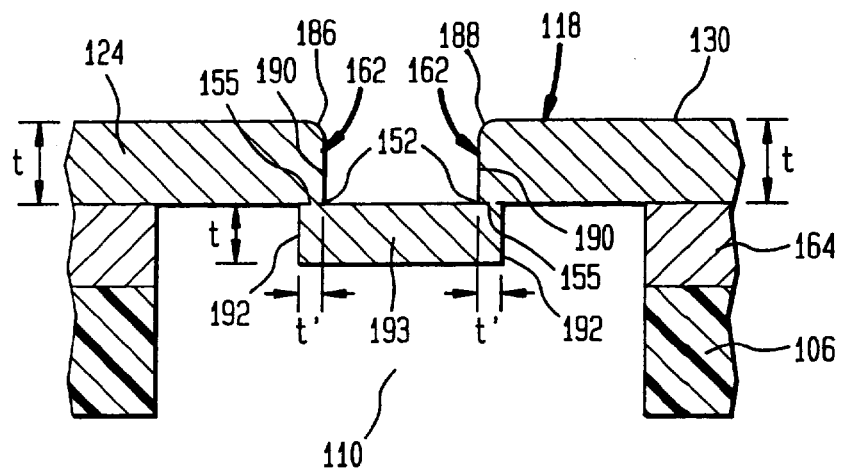

After stripping of the mask 168, a layer of material used to form the leads 118 is deposited onto the outer surface 170 of the base material layer 164 and within the U-shaped opening 174 using the previously described process. As shown in FIG. 11, the leads 118 are formed with first and second connection sections 124, 130 which are arranged generally in the same plane unlike those shown in the FIG. 2 embodiment which are offset from one another in a vertical direction. The frangible intermediate sections 162 have two spaced apart steps 186, 188 formed over steps 176, 178 within the underlying base material layer 164. The frangible intermediate sections 162 are formed by a pair of spaced apart outer and inner walls 190, 192 having a thickness (t') generally in the order of about 15 microns or less. The spacing between the inner walls 192 is about 10–30 microns. The frangible intermediate sections 162 at their lower ends are integrally connected by a central connection section 193. The connection section 193 is arranged in a plane generally parallel to the connection sections 124, 130. It is contemplated that the thickness (t) of the central connection section 193 will be somewhat greater than the thickness (t') of the frangible intermediate section 162, for example, in the order of about 15–20 microns. As with the frangible section 128, the frangible intermediate section 162 may be formed with depressions 152 at the base of the outer walls 190 to further weaken the frangible intermediate sections 162 thereby providing a fracture point 155.

The dielectric layer 106 is masked on its bottom surface 194 by a further mask 196 having patterned openings 198 corresponding to the desired location of the gaps 110 in the support structure 104. Each such opening 198 in the mask 196 is aligned with the connection sections 124, 130, 193 and frangible intermediate sections 162. The structure is then subjected to ablation by radiant energy directed through the opening 198, thereby forming the gaps 110 in alignment with the connection sections 124, 130, 193 of the leads 118 and in alignment with the frangible intermediate sections 162. Subsequently, the exposed portion of the base material layer 164 is etched away so as to expose the leads 118. In this regard, the removal of the base material layer 164 completes the formation of the gaps 110 and frees the connection sections 124, 130, 193 and frangible intermediate section 162 of the leads from the base material layer. The completed connection component 160 can be used in the same manner as previously described with respect to the connection component 102.

Although the invention herein has been described with reference to particular embodiments, it is to be understood that the embodiments are merely illustrative of the principles and application of the present invention. It is therefore to be understood that numerous modifications may be made to the embodiments and that other arrangements may be devised without departing from the spirit and scope of the present invention as defined by the claims.

What is claimed is:

1. A method of making a semiconductor connection component comprising the steps of forming at least one lead extending over a gap extending through a vertical extent of a support structure, each said lead having upper and lower surfaces and including a first connection section having a longitudinal axis extending from the support structure on one side of the gap, a second connection section extending from the support structure on the other side of the gap, and a frangible intermediate section contiguously connecting said connection sections, said frangible intermediate section and at least a part of said first connection section aligned over said gap so that said first connection section of each lead can be detached from said second connection section by breaking the frangible section upon being displaced downwardly in said gap, and forming at least one vertical jog within said frangible intermediate section such that the upper and lower surfaces of the lead are offset from one another at each said vertical jog.

2. The method of claim 1, further comprising the step of providing a base material layer on said support structure, said base material layer having contiguous first and second planar sections of different thickness, and depositing continuous lead-forming material over said first and second planar sections forming said elongated leads.

3. The method of claim 2, wherein said first and second planar sections provide a vertical wall therebetween.

4. The method of claim 3, wherein the step of forming said jog comprises providing a layer of said lead-forming material over said wall having a thickness less than the thickness of said lead-forming material provided over at least one of said first and second planar sections.

5. The method of claim 2, wherein said step of forming said leads includes the step of subdividing a continuous layer of said lead-forming material into said leads.

6. The method of claim 1, further including the step of providing a base material layer on said support structure and forming a depression therein, and depositing continuous lead-forming material over said base material layer and into said depression, whereby said lead-forming material has a U-shape.

7. The method of claim 1, wherein said jog is formed by the lower surface of the second connection section being disposed above the lower surface of the first connection section and the upper surface of the second connection section being disposed above the upper surface of the first connection section.

* * * * *

UNITED STATES PATENT AND TRADEMARK OFFICE
CERTIFICATE OF CORRECTION

PATENT NO. : 6,274,822 B1
DATED : August 14, 2001
INVENTOR(S) : David Light, Belgacem Haba, Thomas H. DiStefano and Konstantine Karavakis It is certified that error appears in the above-identified patent and that said Letters Patent is hereby corrected as shown below:

<u>Title page,</u>
Item [75], "Distefano" should read -- DiStefano --.

Signed and Sealed this

Thirtieth Day of April, 2002

*Attest:*

*Attesting Officer*

JAMES E. ROGAN
*Director of the United States Patent and Trademark Office*